(12) United States Patent
Matsushita et al.

(10) Patent No.: US 6,611,369 B2
(45) Date of Patent: Aug. 26, 2003

(54) OPTICAL SIGNAL AMPLIFIER

(75) Inventors: Shunichi Matsushita, Ichihara (JP); Shu Namiki, Ichihara (JP); Yoshihiro Emori, Ichihara (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/654,974

(22) Filed: Sep. 5, 2000

(65) Prior Publication Data

US 2002/0176153 A1 Nov. 28, 2002

(30) Foreign Application Priority Data

Sep. 6, 1999 (JP) ............................................ 11-251528

(51) Int. Cl.$^7$ ............................ H01S 3/30; H04B 10/12; G02B 6/00
(52) U.S. Cl. ........................ 359/334; 359/341.3; 385/11
(58) Field of Search ............................. 359/334, 341.3, 359/338, 337, 337.4; 385/11

(56) References Cited

U.S. PATENT DOCUMENTS

| 4,616,898 A | 10/1986 | Hicks, Jr. ................ 350/96.15 |
| 4,699,452 A | 10/1987 | Mollenauer et al. ..... 350/96.16 |
| 4,805,977 A | 2/1989 | Tamura et al. ........... 350/96.16 |

(List continued on next page.)

FOREIGN PATENT DOCUMENTS

| EP | 0 615 356 A1 * | 9/1994 | ................ 359/156 |
| EP | 0 734 105 a2 | 9/1996 | |
| EP | 0 877 265 a1 | 11/1998 | |
| EP | 1 018 666 A1 | 7/2000 | |
| JP | 02-012986 | 1/1990 | |
| JP | 10-73852 | 3/1998 | |
| WO | WO 98/42088 | 9/1998 | |

OTHER PUBLICATIONS

Wang, L.J. et al. "Analysis of Polarization–Dependent Gain in Fiber Amplifiers." IEEE J. of Quantum Elect., vol. 34, No. 3, Mar. 1998. pp. 413–418.*
Takesue, H. et al. "Stabilization of Pulsed Lightwave Circulating Around an Amplified Fiber–Optic Ring Incorporating a LOYT Depolarizer." IEEE Photonic Tech. Lett. Dec., 1998. pp. 1748–1750.*
Bruyere, F. et al. "Demonstration of an Optimal Polarization Scrambler for Long–Haul Optical Amplifier Systems." IEEE Photonics Tech. Lett. 6: Sep. 9, 1999 pp. 1153–1155.*
Bennett, J. M. "Physical Optics." The Handbook of Optics, McGraw–Hill, 1995. pp. 5.22–5.25.*
*Broadband Raman Amplifier for WDM Transmission*, Yoshihiro Emori et al., Fifth Optoelectronics and Communications Conference (OECC 2000) Technical Digest, Jul. 10–14, 2000, pp. 26–27.
*Broadband Raman amplifiers design and practice*, Shu Namiki et al., Optical Society of America Conference, Technical Digest, Jul. 9–12, 2000, p. 7–9.
*Cost–effective depolarized diode pump unit desinged for C–band flat–gain Raman amplifier to control EDFA gain profile*, Yoshihiro Emori et al., Optical Society of American Conference, Mar. 5–10, 2000, pp. 106–108.

(List continued on next page.)

Primary Examiner—Thomas G. Black
Assistant Examiner—Andrew R. Sommer
(74) Attorney, Agent, or Firm—Oblon, Spivak, McClelland, Maier & Neustadt, P.C.

(57) ABSTRACT

An optical signal amplifier comprises a light source, a depolarizer, and a gain medium that transfers energy from a pump beam output from the depolarizer to the optical signal. The depolarizer may comprise one or more birefringent optical fibers which support two polarization modes, a fast mode and a slow mode. The light propagates in the fast mode at a higher velocity than the light propagates in the slow mode so as to impart phase delay as the light propagates in the birefringent optical fibers, thereby at least partially depolarizing the beam.

13 Claims, 14 Drawing Sheets

U.S. PATENT DOCUMENTS

| | | | |
|---|---|---|---|
| 4,881,790 A | | 11/1989 | Mollenauer .............. 350/96.16 |
| 4,900,917 A | * | 2/1990 | Dixon ........................ 250/225 |
| 4,941,738 A | * | 7/1990 | Olsson ....................... 350/377 |
| 5,111,322 A | * | 5/1992 | Bergano ..................... 359/122 |
| 5,218,652 A | | 6/1993 | Lutz ............................. 385/11 |
| 5,309,535 A | * | 5/1994 | Bergano ....................... 385/38 |
| 5,345,331 A | * | 9/1994 | Bergano ..................... 359/341 |
| 5,481,391 A | * | 1/1996 | Giles .......................... 359/179 |
| 5,491,576 A | * | 2/1996 | Bergano ..................... 359/156 |
| 5,539,566 A | * | 7/1996 | Terahara ..................... 359/179 |
| 5,563,732 A | | 10/1996 | Erdogan et al. ............ 359/341 |
| 5,600,482 A | * | 2/1997 | Watanabe ................... 359/341 |
| 5,692,082 A | | 11/1997 | Fukushima .................. 385/88 |
| 5,729,372 A | * | 3/1998 | Terahara ..................... 359/180 |
| 5,793,512 A | * | 8/1998 | Ryu ........................... 359/160 |
| 5,883,736 A | | 3/1999 | Oshima et al. ............. 359/341 |
| 5,887,093 A | | 3/1999 | Hansen et al. ................ 385/27 |
| 6,115,174 A | | 9/2000 | Grubb et al. ............... 359/334 |
| 6,147,794 A | * | 11/2000 | Stentz ........................ 359/334 |
| 6,151,160 A | * | 11/2000 | Ma et al. .................... 359/124 |
| 6,292,288 B1 | | 9/2001 | Akasaka et al. ............ 359/334 |
| 6,342,965 B1 | | 1/2002 | Kinoshita ................... 359/334 |
| 6,344,923 B1 | | 2/2002 | Blondel et al. ............. 359/334 |
| 6,356,383 B1 | * | 3/2002 | Cornwell et al. ........... 359/334 |
| 6,404,542 B1 | * | 6/2002 | Ziari et al. ................ 359/341.3 |
| 6,522,796 B1 | * | 2/2003 | Ziari et al. .................... 385/11 |
| 2001/0036004 A1 | | 11/2001 | Ackerman et al. .......... 359/334 |

OTHER PUBLICATIONS

*1480 nm Pumping Laser with Fiber Bragg Grating*, Akira Mugino et al., Technical Report of IEICE, *The Institute of Electronics, Information and Communication Engineers*, pp. 37–42, 1998.

*Pump Interactions in a 100–nm Bandwidth Raman Amplifier*, Howard Kidof et al., *IEEE Photonics Technology Letters.*, vol. 11, No. 5 May 1999.

*Properties of Fiber Raman Amplifiers and Their Applicability to Digital Optical Communication Systems*, Yasuhiro Aoki, *Journal of Lightwave Technology*, vol. 6, No. 7, Jul. 1988.

*Amplified Spontaneous Raman Scattering in Fiber Raman Amplifiers*, Kiyofumi Mochizuki et al., *Journal of Lightwave Technology*, vol. LT–4, No.9, pp. 1328–1333, Sep. 1986.

*Optical Fiber Transmission Systems Using Stimulated Raman Scattering: Theory*, Kiyofumi Mochizuki, *Journal of Lightwave Technology*, vol. Lt–3. Jun. 3, 1985, pp. 688–694.

*Amplified Spontaneous Raman Scattering and Gain in Fiber Raman Amplifiers*, Mark L. Dakss et. al., *Journal of Lightwave Technology*, vol. Lt–3, No. 4, Aug. 1985, pp. 806–813.

*Polarization Effects in Fiber Raman and Brillouin Lasers*, Rogers H. Stolen, *IEEE Journal of Quantum Electronics*, vol. QE–15, No 10, Oct. 1979, pp. 1157–1160.

*Spontaneous and Stimulated Raman Scattering in Long Low Loss Fibers*, John Auyeung et. al., *IEEE Journal of Quantum Electronics*, vol. QE–14, No. 5, May 1978, pp. 347–352.

*Degree of polarization in jointed fibers: the Lyot depolarizer*, Kiyofumi Mochizuki, *Applied Optics*, vol. 23, No. 19, Oct. 1, 1984, pp. 3284–3288.

*Performance of Lyot Depolarizers with Birefringent Single–Mode Fibers*, Konrad Böhm et al., *Journal of Lightwave Technology*, vol. LT–1, No. 1, Mar. 1983, pp. 71–74.

*A Monochromatic Depolarizer*, Bruce H. Billings, *Journal of the Optical Society of America*, vol. 41, No. 12, Dec., 1951, pp. 966–975.

Kim, I.S. et al. "Coherence Collapsed 1.3–Multimode Laser Diode for the Fiber–Optic Gyroscope" (Apr. 1995) Optics Letters Optical Society of Am Washington vol. 20 No. 7 pp. 731–733.

Wang J.S. et al. "Reductin of the Degree of Polarization of a Laser Diode with a Fiber Lyot Depolarizer" (Nov. 1999) IEEE Photonics Technology Letters vol. 11 No. 11 pp. 1449–1451.

N. Edagawa et al., *Amplification Characteristics of Fibre Raman Amplifiers, Institute of Electronics, Information and Communication Engineers*, vol. 88, No. 87, 1988, (OQE–33), pp. 61–68 (including one page English translation of the Summary).

Lewis et al., *Electronics Letters*, vol. 35, No. 20, Sep. 30, 1999, pp. 1761–1762 (one page abstract only).

Yoshihiro Emori et al., *State of the art in diode pumped Raman amplifiers*, OAA 2001, 3 pages.

Anders Berntson et al., *Polarisation dependence and gain tilt of Raman amplifiers for WDM systems, Optical Society of America*, 2000, 3 pages.

Jianping Zhang et al., *Dependence of Raman Polarization Dependent Gain on Pump Degree of Polarization at High Gain Levels, Optical Society of America*, OCC'2000, 3 pages. Jul. 2000.

N. Edagawa et al., *Simultaneous Amplification of Wavelength–Division–Multiplexed Signals by a Highly Efficient Fibre Raman Amplifier Pumped by High–Power Semiconductor Lasers, Electronics Letters*, vol. 23, No. 5, Feb. 26, 1987, pp. 196–197 (with one page abstract).

H. Masuda et al., *Ultra–wideband hybrid amplifier comprising distributed Raman amplifier and erbium–doped fibre amplifier, Electronics Letters*, vol. 34, No. 13, Jun. 25, 1998, pp. 1342–1344.

Hiroji Masuda et al., *75–nm 3–dB Gain–band Optical Amplification with Erbium–doped Fluoride Fibre Amplifiers and Distributed Raman Amplifiers in 9×2.5–Gb/s WDM Transmission Experiment, ECOC 97*, Conference Publication No. 448, Sep. 22–25, 1997, pp. 73–76 plus one page Abstract.

K. Aida et al., *Design and performance of a long–span IM/DD optical transmission system using remotely pumped optical amplifiers, IEE Proceedings*, vol. 137, Pt. J, No. 4, Aug. 1990, pp. 225–229, plus one page Abstract.

Govind P. Agrawal, *Nonlinear Fiber Optics, Second Edition, Academic Press*, 1995, pp. 328–334.

K. I. Suzuki et al., *Bidirectional 10–channel 2.5 Gbit/s WDM transmissions over 250 km using 76nm (1531–1607 nm) gain–band bidirectional erbium–doped fibre amplifiers, Electronics Letters*, Aug. 15, 1997.

Ryuichi Sugizaki et al., *Polarization insensitive broadband transparent DCF module with faraday rotator mirror, Raman–amplified by single polarization diode–laser pumping*, Communication, OFC/IOOC '99, Technical Digest, vol. 1, Feb. 21–26, 1999, pp. 279–281 (with one page abstract).

Pending U.S. patent application No. 09/886,211, filed Jun. 22, 2001.

Pending U.S. patent application No. 09/886,212, filed Jun. 22, 2001.

Pending U.S. patent application No. 09/944,601, filed Sep. 4, 2001.

*Fibre Raman amplifier for 1520 nm band WDM transmission*, J. Kani et al., *Electronics Letters*, Sep. 3, 1998, vol. 34, No. 18, pp. 1745–1747.

*Broadband Silica Fibre Raman Amplifiers at 1.3 μm and 1.5 μm*, S.V. Chernikov et al., *ECOC'98*, Sep. 20–24, 1998, Madrid, Spain, pp. 49–50.

*Fibre Raman amplifiers for broadband operation at 1.3 μm*, D.V. Gapontsev et al., *Optics Communications*, Aug. 1, 1999, 166 (1999) pp. 85–88.

*A 92nm Bandwidth Raman Amplifier*, Karsten Rottwitt et al., *OFC98*, pp. PD6–1–PD6–4. (1998).

*Single–Channel to Multi–Channel Upgrade of 10–Gb/s Transmission Systems by Raman Amplification*, P.B. Hansen et al., *22nd European Conference on Optical Communication—ECOC'96, Oslo*, pp. 2.147–2.150. (1996).

* cited by examiner

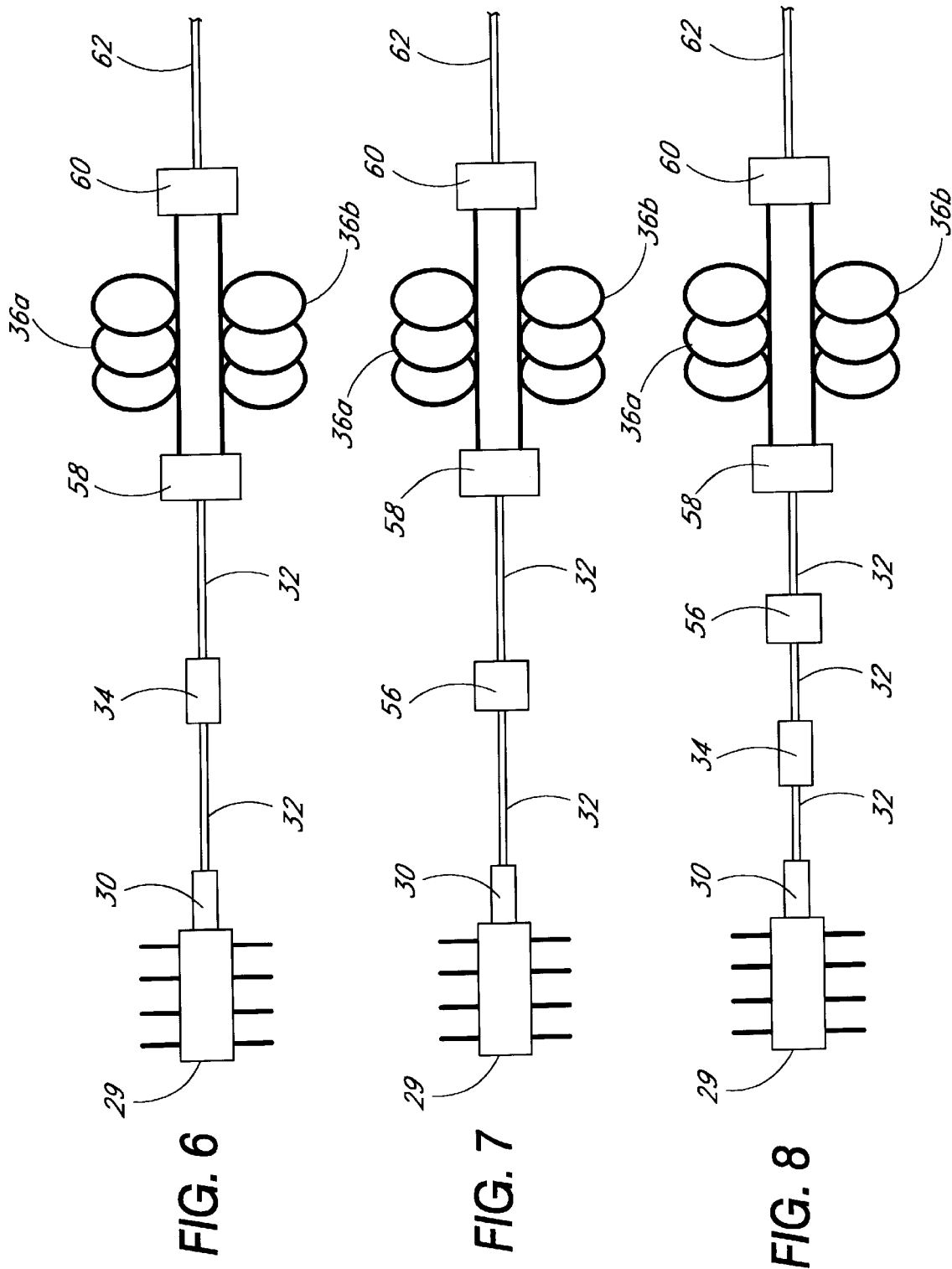

OPTICAL SIGNAL AMPLIFIER

BACKGROUND

The present invention relates to fiber optic communications systems, and more specifically, to amplification of optical signals propagating in an optical fiber.

Optical signals for conveying information in a fiber optic communication system experience attenuation as the optical signals are transmitted though an optical fiber over extended distances. The attenuated optical signal can be regenerated using amplifiers such as optical fiber Raman amplifiers, which rely on stimulated Raman scattering to transfer energy to the optical signal. The optical fiber Raman amplifier comprises a fiber that receives two input beams: a pump beam and the optical signal. Energy in the pump beam is coupled into the signal beam through stimulated Raman scattering, and the optical signal is thereby amplified upon passing through the fiber amplifier. The extent of amplification or gain depends on the relation between the polarization of the pump beam and that of the signal beam. If both the pump beam and the signal beam are linearly polarized and have electric fields oriented in the same direction, then the gain is higher than if the electric fields are oriented perpendicular to each other. Disadvantageously, fluctuations in the polarization of the signal or pump beam that cause the relative orientations of the electric fields to vary produce fluctuations in the gain of the amplifier. For example, the gain will decrease for pump and signal beams that initially have electric fields oriented parallel but are reoriented so as to no longer be parallel. Conversely, gain will increase if the beams are initially perpendicular but subsequently contain parallel components. Such fluctuations in the gain cause variations in the intensity of the optical signal, which introduces noise into the signal and thereby increases the likelihood of errors in transmitting information over optical fibers.

In conventional systems designed to minimize fluctuations in gain, the pump beam is provided by two or more semiconductor lasers that output polarized light. The polarized light is directed to a coupler that combines the light from the different semiconductor lasers after first separating the respective beams into perpendicular polarizations. For example, in the case where two semiconductors are employed to pump the fiber amplifier, light emitted from the two semiconductors is input into the coupler. The coupler causes the polarized light beams from the two semiconductor lasers to have electric fields oriented perpendicular to each other and produces a combined beam that is then directed to the optical fiber Raman amplifier.

Although employing a plurality of semiconductor lasers can reduce the fluctuations in gain, requiring more than one semiconductor laser adds to the complexity of the amplifier. What is needed is a design for an optical fiber Raman amplifier that is simpler and less expensive yet that minimizes the fluctuation in gain caused by variations in polarization of the pump and signal beams.

SUMMARY

Methods and apparatus for optical signal amplification are provided. In one embodiment, an amplifier for amplifying optical signals comprises a light source having as an output a first beam of light characterized by a first degree of polarization, a depolarizer optically connected to the light source so as to receive the first light beam as an input and having as an output a pump beam characterized by a second degree of polarization wherein said second degree of polarization is less than said first degree of polarization. A gain medium is optically connected to the depolarizer so as to receive the optical signal and the pump beam as inputs and is configured to transfer energy from the pump beam to the optical signal. The depolarizer advantageously comprises one or more birefringent optical fibers.

A method of making an optical signal amplifier in one embodiment of the invention comprises coupling a light source to an input of at least one birefringent optical fiber and coupling an output of said at least one birefringent optical fiber to a gain medium.

Methods of optical signal amplification include collecting light from a light source that emits at least partially polarized light divisible into light of two orthogonal linearly polarized states. This collected light is at least partially depolarized by imparting phase delay between the light of the two orthogonal linearly polarized states and is then directed into a gain medium of an optical signal amplifier. In another embodiment, a method of minimizing polarization induced gain fluctuations in an optical signal amplifier comprises at least partially depolarizing a beam of light from a first light source without combining the beam of light with a second beam of light from a second light source. This at least partially depolarized beam of light is used as a pump beam in the optical signal amplifier.

BRIEF DESCRIPTION OF THE DRAWINGS

FIG. 6 is a schematic view of a preferred embodiment of the present invention similar to that shown in FIG. 5 additionally comprising a fiber Bragg grating inserted in the non-depolarizing birefringent optical fiber.

FIG. 7 is a schematic view of a preferred embodiment of the present invention similar to that shown in FIG. 5 additionally comprising a polarization controller inserted in the non-depolarizing birefringent optical fiber.

FIG. 8 is a schematic view of a preferred embodiment of the present invention similar to that shown in FIG. 5 additionally comprising a fiber Bragg grating and a polarization controller inserted in the non-depolarizing birefringent optical fiber.

DETAILED DESCRIPTION

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Figure 1A:
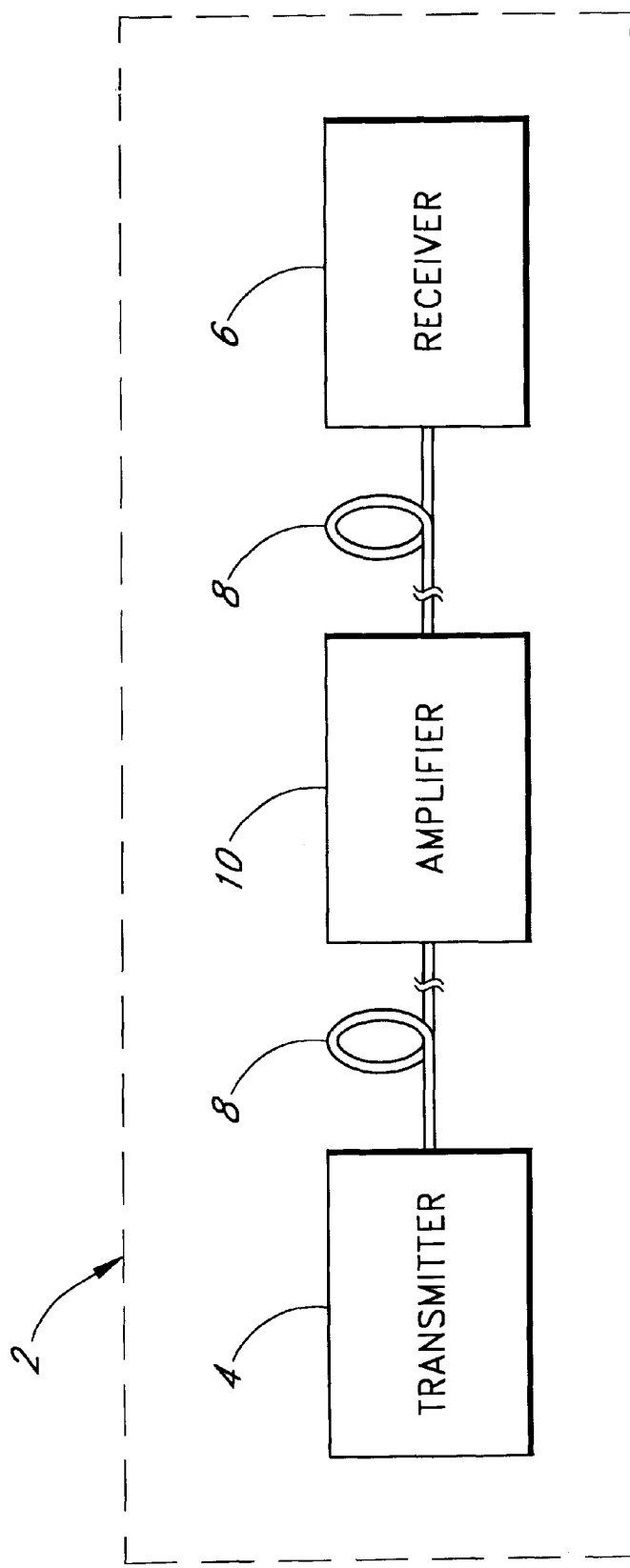
FIG. 1A is a schematic diagram of an optical communication system employing an optical amplifier.

As shown in FIG. 1A, a fiber optical communication system 2 comprises a transmitter 4 optically connected to a receiver 6 through an optical fiber 8. An amplifier 10 such as an optical fiber Raman amplifier may be inserted between two segments at the optical fiber 8. The transmitter 4 comprises an optical source such as a laser diode which emits an optical beam that is modulated to introduce a signal onto the beam. The optical signal beam is coupled into the optical fiber 8, which carries the beam to the receiver 6. At the receiver 6, the optical signal is converted into an electrical signal via an optical detector. To ensure that the optical signal is sufficiently strong such that the modulation can be accurately detected at the receiver 6, amplification is provided by the optical fiber Raman amplifier 10. Such amplification is especially critical when the optical signal is transported over long distances within the optical fiber 8.

Figure 1B:
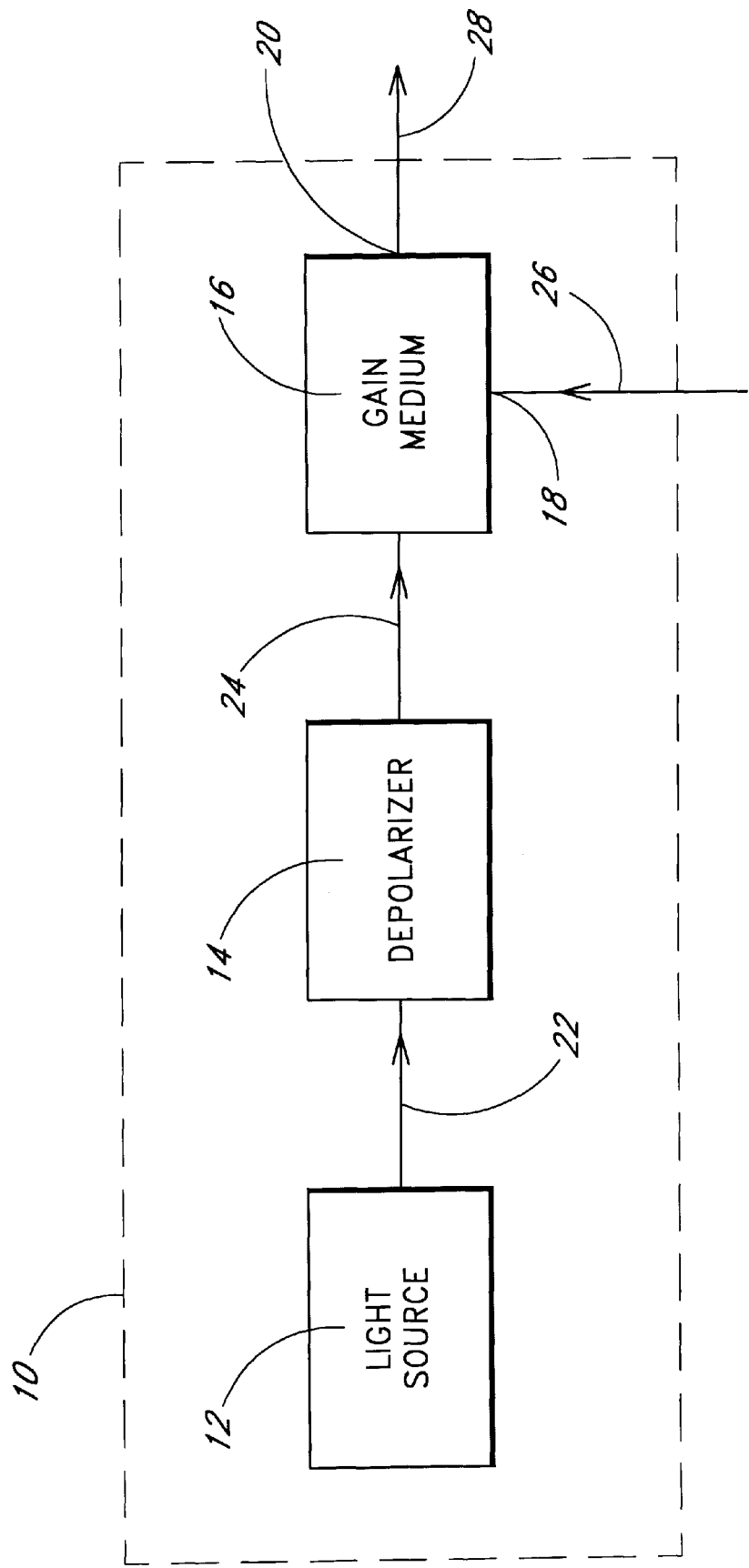
FIG. 1B is a block diagram of a preferred embodiment of the optical amplifier comprising a pump laser, a depolarizer, and a gain medium.

A block diagram of the optical fiber Raman amplifier 10 that is a preferred embodiment of the present invention is shown in FIG. 1B. The Raman amplifier 10 comprises a light source 12, a depolarizer 14, and a gain medium 16 and also has an input 18 for the optical signal that is to be amplified and an output 20 for the amplified optical signal. The light source 12 may comprise a single light generator or a plurality of light generators having the same or different wavelengths.

The light source 12 emits a beam of light represented by a line 22 extending from the light source 12 in FIG. 1B. Preferably, the beam of light 22 and the optical signal are separated in wavelength by about 50 to 200 nanometers (nm), and more preferably, by about 100 nanometers. The light source 12 may, for example, comprise a semiconductor laser or laser diode. As is well known in the art, semiconductor laser diodes generally emit light that is substantially linearly polarized, i.e., electromagnetic waves having an electric field oriented in a fixed direction. To provide a constant level of gain in the gain medium 16, as will be discussed more fully below, the pump beam preferably comprises substantially unpolarized light, not linearly polarized light. Accordingly, the beam 22 is directed to the depolarizer 14, which receives the linearly polarized light and at least partially depolarizes the light. In preferred embodiments, the output of the depolarizer 14 comprises at least partially depolarized light. Most preferably, this output comprises substantially unpolarized light; all or substantially all of the beam 22 emitted by the light source 12 is depolarized by the depolarizer 14.

The light beam 22, after passing through the depolarizer 14 is directed to the gain medium 16 as depicted by line 24 extending from the depolarizer to the gain medium. The beam entering the gain medium 24 is referred to herein as the pump beam. The optical signal is also sent to the gain medium 16 as illustrated by line 26 in FIG. 1B. The optical signal enters the input 18, is amplified within the gain medium 16, and exits the output 20 a stronger signal, which is represented by a line 28 emanating from the gain medium. Within the gain medium 16, energy from the pump beam 24 is coupled to the signal 26 via stimulated Raman scattering as is well known in the art.

As discussed above, the extent of amplification depends on the relation between the polarization states of the pump beam and the optical signal. The optical signal also comprises electromagnetic waves having an electric field and a magnetic field. If the electric field of the optical signal is directed parallel to the electric field of the pump beam, the amplification provided by the gain medium 16 will be maximized. Conversely, if the electric fields are perpendicular to each other, a minimum in gain results. When the electric fields are not fully parallel or perpendicular, but contain both parallel and perpendicular components, the gain will have a value somewhere between the minimum and maximum depending on the magnitude of the parallel and perpendicular components. Accordingly, as the relative orientation of the electric fields in the pump beam and the optical signal vary, the gain will vary. If, however, the pump beam remains entirely unpolarized, containing no predominant linear polarized component, the gain will not fluctuate. Thus, by passing the light emitted by the light source 12 through the depolarizer 14, the variations in the amount that the optical signal 26 is amplified can be reduced.

In another configuration, the pump beam itself can be amplified by another pump beam using an additional gain medium. In this case, using depolarized light source to pump this additional gain medium will reduce the fluctuation of the power of the pump beam caused by polarization dependent gain fluctuations.

FIGS. 2–8 depict preferred embodiments of the optical fiber Raman amplifier 10 of the present invention in which the depolarizer 14 comprises one or more birefringent optical fibers. The one or more birefringent optical fibers are configured to at least partially depolarize light from the light source 12.

Figure 2A:
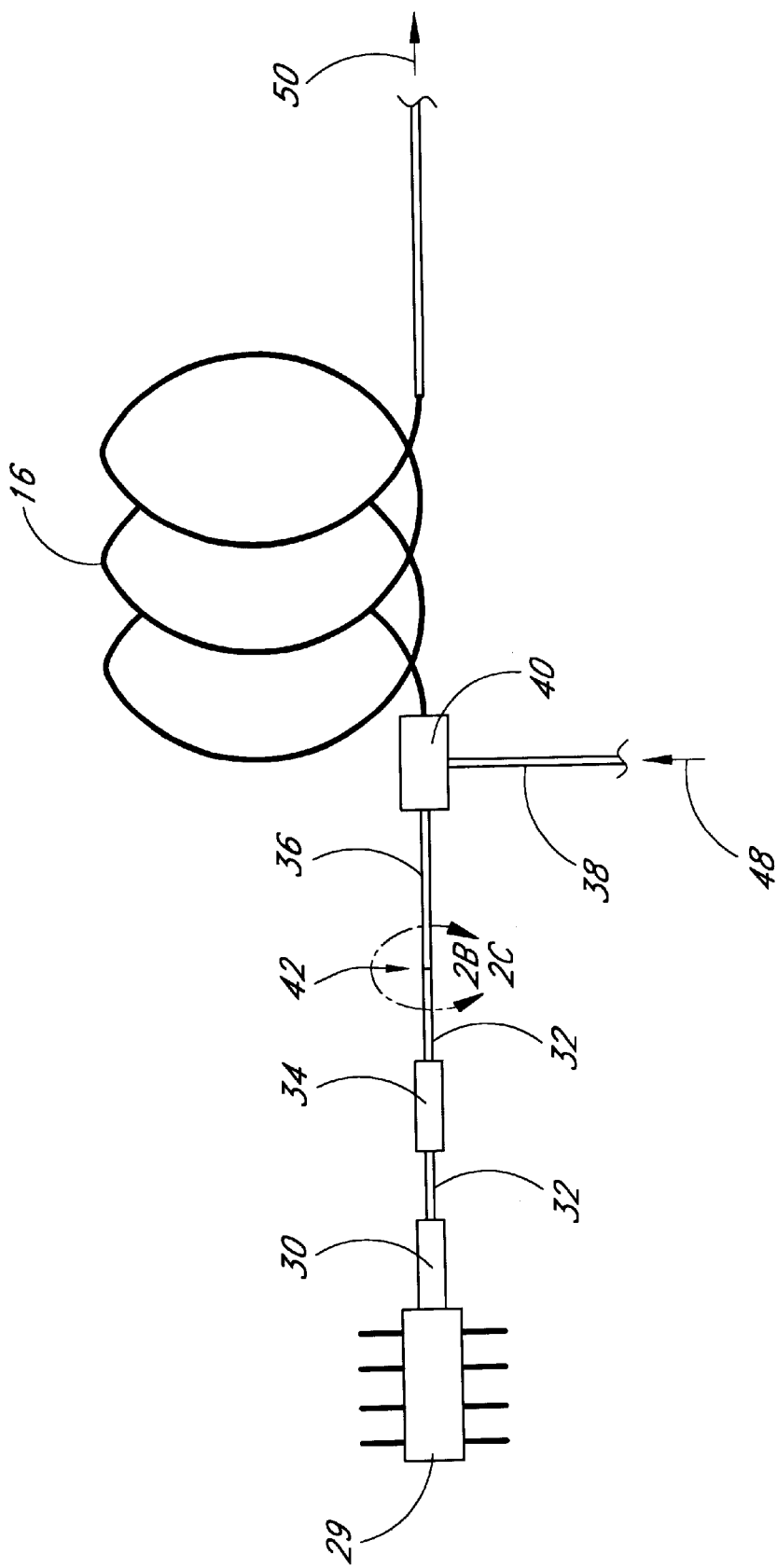
FIGS. 2A–2C are schematic views of preferred embodiments of the present invention comprising a non-depolarizing birefringent optical fiber joined to a depolarizing birefringent optical fiber so as to provide a mismatch between respective principal axes of the two fibers.

Referring now to FIG. 2A, the light source 12 advantageously comprises a semiconductor laser 29 which is coupled through a fiber connector 30 to a birefringent optical fiber 32. In this embodiment, the birefringent optical fiber 32 functions as part of the light source 12 and does not function as the depolarizer 14 and, therefore, is hereinafter referred to as the non-depolarizing birefringent fiber. This non-depolarizing birefringent optical fiber 32 has a fiber Bragg grating 34 inserted therein. The fiber Bragg grating 34 comprises a diffracting reflector, which when employed in association with the semiconductor laser 29, transmits a wavelength band of light output the laser. The non-depolarizing birefringent optical fiber 32 is connected to another birefringent optical fiber 36 that serves as the depolarizer 14 and, accordingly is denoted the depolarizing birefringent optical fiber. This depolarizing birefringent optical fiber 36, along with an input optical fiber 38 for carrying the optical signal, are attached to an optical coupler 40 that leads to the gain medium 16, namely, an optical fiber Raman gain medium, which produces gain through stimulated Raman scattering. Preferably, the optical fiber Raman gain medium 16 comprises quartz, and more preferably, ion-doped quartz.

Figure 2B:
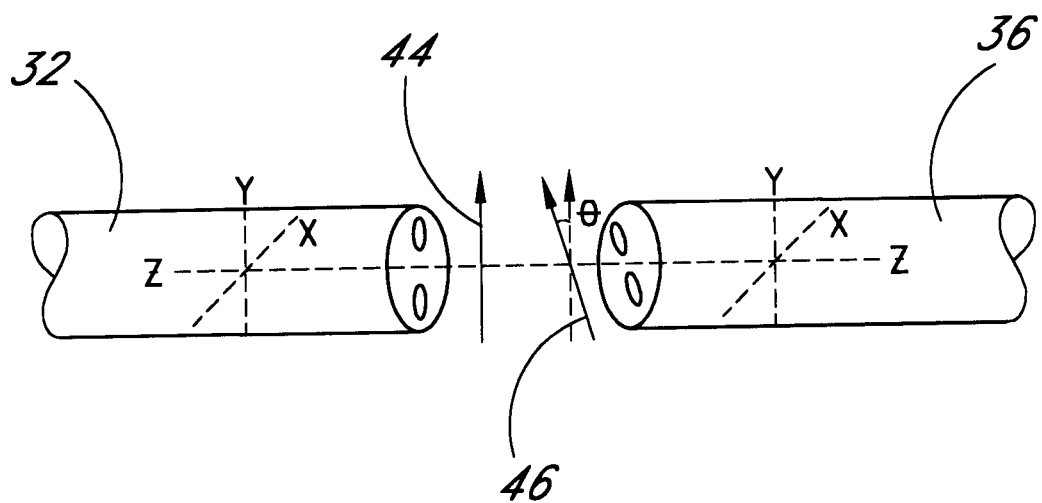
Figure 2C:
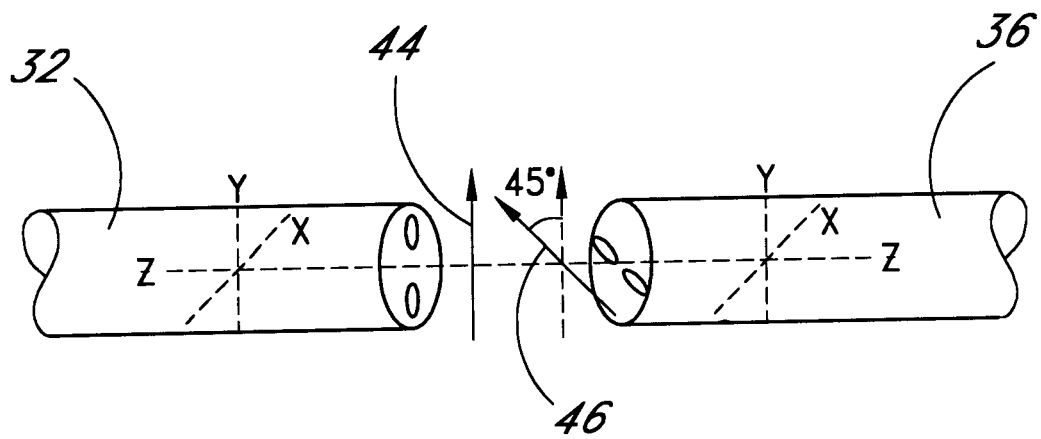

The non-depolarizing and depolarizing birefringent optical fibers 32, 36 are coupled together at a point 42, a close-up of which is depicted in FIGS. 2B and 2C. As shown in FIGS. 2B and 2C, a longitudinal axis, z, runs down the length of the non-depolarizing and depolarizing birefringent optical fibers 32, 36. Mutually perpendicular x (horizontal) and y (vertical) axes extend through and are perpendicular to the z axis.

The non-depolarizing and depolarizing birefringent optical fiber 32, 36 each have a central core and a cladding. As is conventional, the core has a refractive index that is higher than that of the cladding. Stress imparting layers (not shown) are disposed in the cladding, the core sandwiched therebetween. As a result of this sandwich structure, the refractive index of the core is different for light linearly polarized in the x direction and light linearly polarized in the y direction, that is, for electromagnetic radiation having an electric field parallel to the x axis and electromagnetic radiation having an electric field parallel to the y axis, respectively. Consequently, linearly polarized light having a polarization parallel to the horizontal direction travels through the birefringent optical fiber 32, 36 at a different velocity than light having a polarization parallel to the vertical direction. In accordance with convention, and as used herein, one of these axes, the x axis or they axis, is referred to as the fast axis, and the other axis is referred to as the slow axis. Light having an electric field aligned with the fast axis, propagates along the length of the core at a higher velocity than light having an electric field aligned with the slow axis. Like the x and y axes, the fast and slow axes are perpendicular. Also as used herein, the term principal axes corresponds to the fast and slow axes.

In this embodiment of the invention, the non-depolarizing birefringent optical fiber 32 is oriented such that one of the principal axes of this fiber matches the polarization of the light emitted by the semiconductor laser 29. For example, the non-depolarizing birefringent optical fiber 32 may be rotated about its length, the z axis, such that its fast axis is aligned and parallel with the electric field of the electromagnetic radiation from the semiconductor laser 29 that is transmitted through the non-depolarizing birefringent fiber.

Also, in accordance with the present invention, the depolarizing birefringent optical fiber 36 is oriented such that the principal axes of the non-depolarizing birefringent fiber 32 are not aligned with the principal axes of the depolarizing birefringent fiber. An exemplary arrangement of the non-depolarizing and depolarizing birefringent optical fibers 32, 36 is shown in FIGS. 2B and 2C where the non-depolarizing birefringent optical fiber has a principal axis, e.g., a fast axis, represented by a first arrow 44 while the depolarizing birefringent optical fiber has a principal axis, also a fast axis, represented by a second arrow 46. The fast axis of the depolarizing optical fiber 36 is rotated about the length of the fiber, or the z axis, by a non-zero angle θ with respect to the fast axis of the non-depolarizing optical fiber 32. As shown in FIG. 2C, the angle θ preferably equals 45°.

In operation, the semiconductor laser 29 emits a light beam comprising substantially linearly polarized light that is coupled into the non-depolarizing birefringent optical fiber 32 by the fiber connector 30. As discussed above, one of the principal axes, the fast or slow axis, of the non-depolarizing birefringent optical fiber 32 is parallel to the electric field of the pump beam. This arrangement maintains the polarization of the pump beam as it is transmitted through the non-depolarizing birefringent optical fiber 32. The light within the non-depolarizing birefringent optical fiber 32 passes through the fiber Bragg defractive grating 34, which provides a resonator external to the semiconductor laser 29, thereby stabilizing the wavelength of the pump beam and narrowing its bandwidth.

Also as described above, the principal axes of the depolarizing birefringent optical fiber 36 are nonparallel to the principal axes of the non-depolarizing birefringent optical fiber 32. Accordingly, the electric field of the pump beam that is transmitted through the non-depolarizing birefringent optical fiber 32 is nonparallel to both the fast and slow axes of the depolarizing birefringent optical fiber 36. For purposes of understanding, the electric field for electromagnetic radiation passing through a birefringent fiber can be separated into two components, one parallel to the fast axis and one parallel to the slow axes, the vector sum of these two components being equal to the electric field. Similarly, light comprising the light source can be separated into two components, linearly polarized waves polarized in a direction parallel to the fast axis and linearly polarized waves polarized parallel to the slow axis. The two sets of waves are transmitted through the depolarizing birefringent optical fiber 36, but at different velocities. Thus, after passing through the depolarizing birefringent optical fiber 36 and upon reaching the optical coupler 40 and the optical fiber Raman gain medium 16, one of the sets of waves, the one polarized parallel to the slow axes, experiences phase delay with respect to the one polarized parallel to the fast axis.

The phase delay translates into optical path difference between the two sets of waves. The amount of optical path difference depends on the disparity in velocity as well as the length of the depolarizing birefringent optical fiber 36. The longer the optical path difference, the less correlation in phase between the light polarized in a direction parallel to the fast axis and light polarized parallel to the slow axis. For sufficiently long lengths of fiber 36, the optical path difference will be as much as or longer than the coherence length of the light from the semiconductor laser 29, in which case, coherence between the two sets of waves will be lost. No longer being coherent, the relative phase difference between the two sets of waves will vary rapidly and randomly.

Unpolarized light can be synthesized from two incoherent orthogonal linearly polarized waves of equal amplitude. Since the light polarized in a direction parallel to the fast axis and the light polarized parallel to the slow axis are incoherent, orthogonal linearly polarized light, together they produce unpolarized light. This conclusion arises because the two sets of waves, which have orthogonal electric fields and a relative phase difference that varies rapidly and randomly, combine to form a wave having an electric field whose orientation varies randomly. Light with a randomly varying electric field does not have a fixed polarization. Thus, light having rapidly varying polarization states, i.e., unpolarized light, is produced.

The at least partly depolarized pump beam is directed to the optical coupler 40, which also receives the optical signal transmitted through the input optical fiber 38. The propagation of the optical signal through the input optical fiber 38 and to the optical coupler 40 is represented by a first arrow 48 shown in FIG. 2A. The two beams, the pump beam and the optical signal, are combined or multiplexed in the optical coupler 40 and fed into the optical fiber Raman gain medium 16, which transfers energy from the pump beam to the optical signal via stimulated Raman scattering. The optical signal exits the optical fiber Raman gain medium 16 as an amplified signal indicated by a second arrow 50 shown in FIG. 2A. Since the pump beam is at least partly depolarized upon passing through the depolarizing birefringent optical fiber 36, the fluctuations in the amplification provided by the optical fiber Raman gain medium 16 are minimized.

Another embodiment of the present invention comprises a LYOT type depolarizer having two birefringent optical fibers, one fiber having a length two times or more as long as the other fiber, i.e., with respective lengths set by the ratio of 1:2 or 2:1. These two optical fibers 32, 36 are fused together so that the principal axes thereof are inclined at an angle θ of 45° with respect to each other. The extent that the depolarizing birefringent optical fiber 36 is rotated about the z axis determines the amount of light that is polarized parallel to the fast axis and the amount of light that is polarized parallel to the slow axis. When θ equals 45°, as depicted in FIG. 2C, the magnitude of the electric fields for the waves propagating parallel to the fast and slow axis are the same; thus, the intensities of the two waves are equal. As discussed above, unpolarized light can be synthesized from two incoherent orthogonal linearly polarized waves of equal amplitude. Since the magnitudes of the two incoherent orthogonal linearly polarized waves are equivalent, substantially unpolarized light can be produced.

For other values of θ not equal to 45°, the magnitudes of the electric fields for the waves propagating parallel to the fast and slow axis are not the same as for the configuration shown in FIG. 2B. For the purposes of understanding, the combination of the fast and slow waves can be separated into a sum of two parts. The first part comprises equal magnitude orthogonal incoherent waves having electric fields parallel to the fast and slow axis, the combination of which produces unpolarized light. The second part comprises the remainder, a component from the larger of the two waves, which has an electric field parallel either to the fast or slow axis. This part is linearly polarized. Thus, a portion of the light will be unpolarized and a portion of the light will be linearly polarized. The pump beam will not be completely depolarized.

A ratio of the intensities of the polarized component to the sum of the intensities of the polarized and unpolarized components is known in the art as the degree of polarization (DOP). The DOP is generally expressed in percentage. Changing the angle between the principal axes of the non-depolarizing and depolarizing birefringent optical fiber 32, 36 changes the DOP. For example, if the angle θ is changed from 45°, on condition that the depolarizing birefringent optical fiber has the same length, the degree of polarization (DOP) of the pump beam becomes larger. Accordingly, the angle between the principal axes of the non-depolarizing and depolarizing birefringent optical fiber 32, 36, in part, controls the DOP.

Figure 3A:
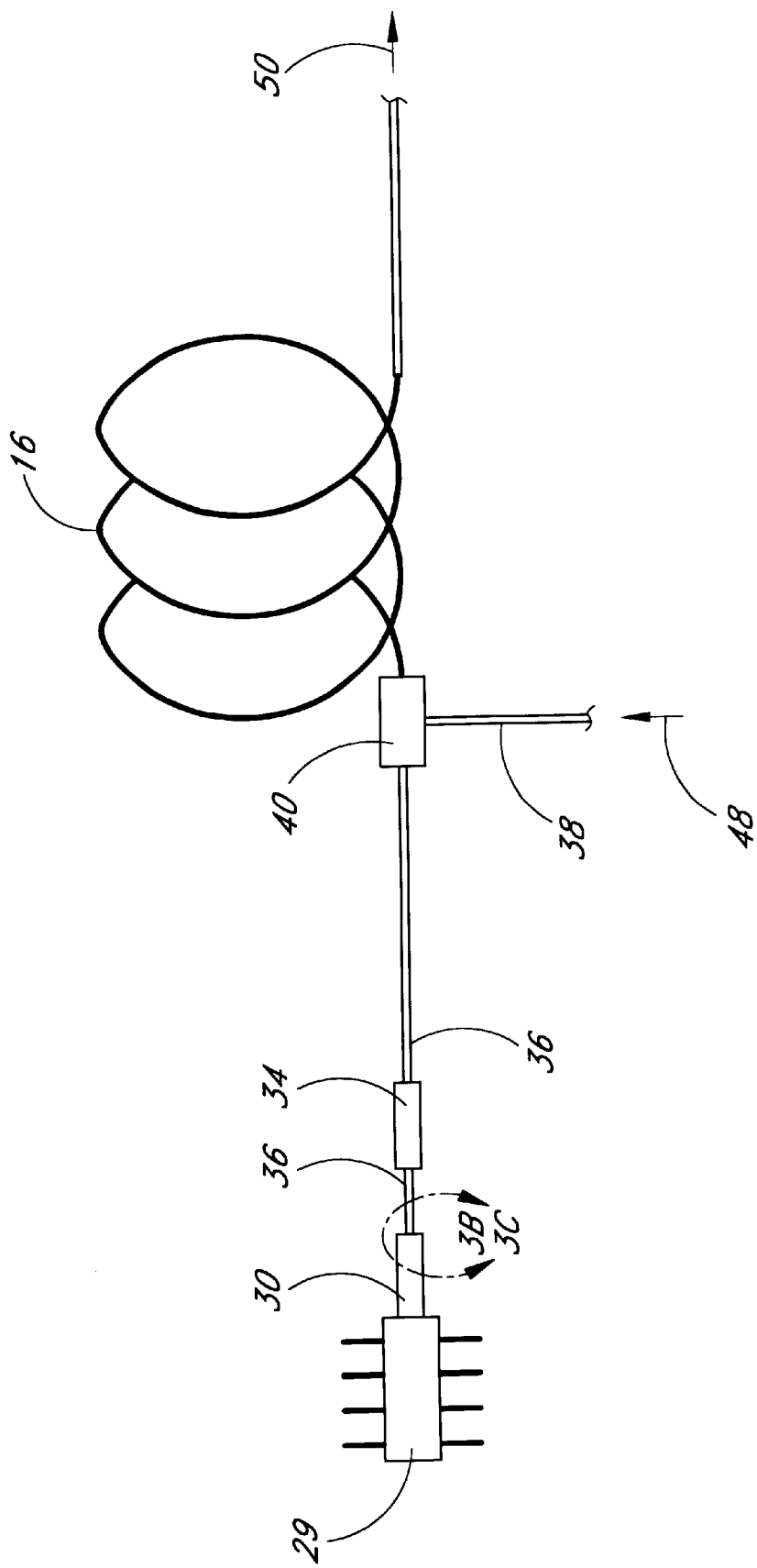
FIGS. 3A–3C are schematic views of preferred embodiments of the present invention comprising a pump laser that emits linearly polarized light having an electric field oriented in a fixed direction and a depolarizing birefringent optical fiber having principal axes that are not aligned with the electric field of the polarized light.
Figure 3B:
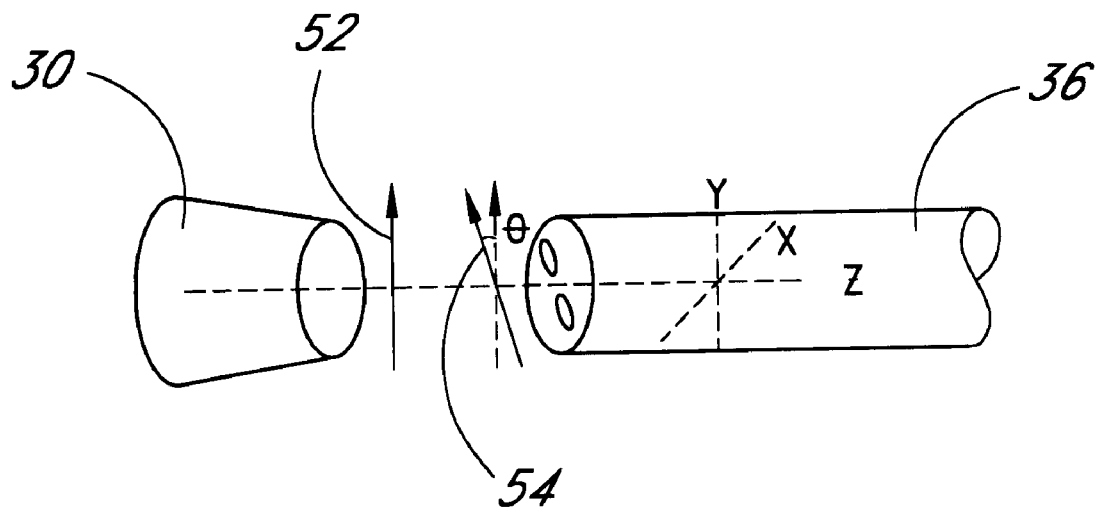
Figure 3C:
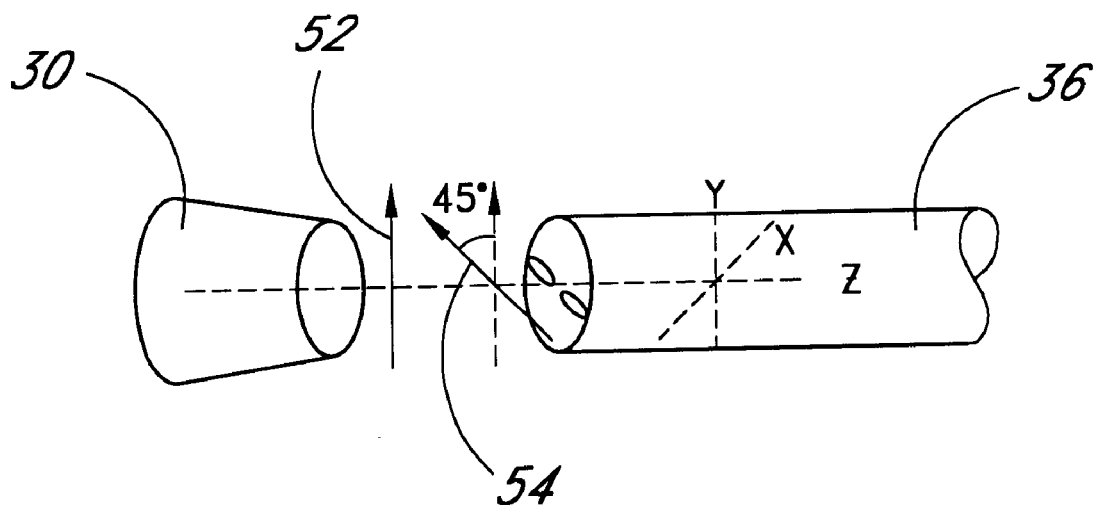

FIGS. 3A–3C depict other preferred embodiments of the invention wherein the semiconductor laser 29 is joined to the depolarizing birefringent fiber 36 through the fiber connector 30. This depolarizing birefringent fiber 36 is directly attached with the optical coupler 40, which receives the optical input fiber 38 and is connected to the optical fiber Raman gain medium 16. This depolarizing birefringent fiber 36 is also oriented such that its principal axes are not aligned with the electric field of the beam output by the semiconductor laser 29. For example, FIGS. 3B and 3C show light emitted by the semiconductor laser 29 that is polarized in the vertical direction as indicated by a first arrow 52. However, one of the principal axes of the depolarizing birefringent optical fiber 36 (represented by a second arrow 54) is rotated about the z axis by a non-zero angle θ with respect to the vertical direction. As shown in FIG. 3C, the angle θ preferably equals 45° such that equal amounts of light polarized parallel to the fast and slow axes propagate through the depolarizing birefringent optical fiber 36.

Figure 4:
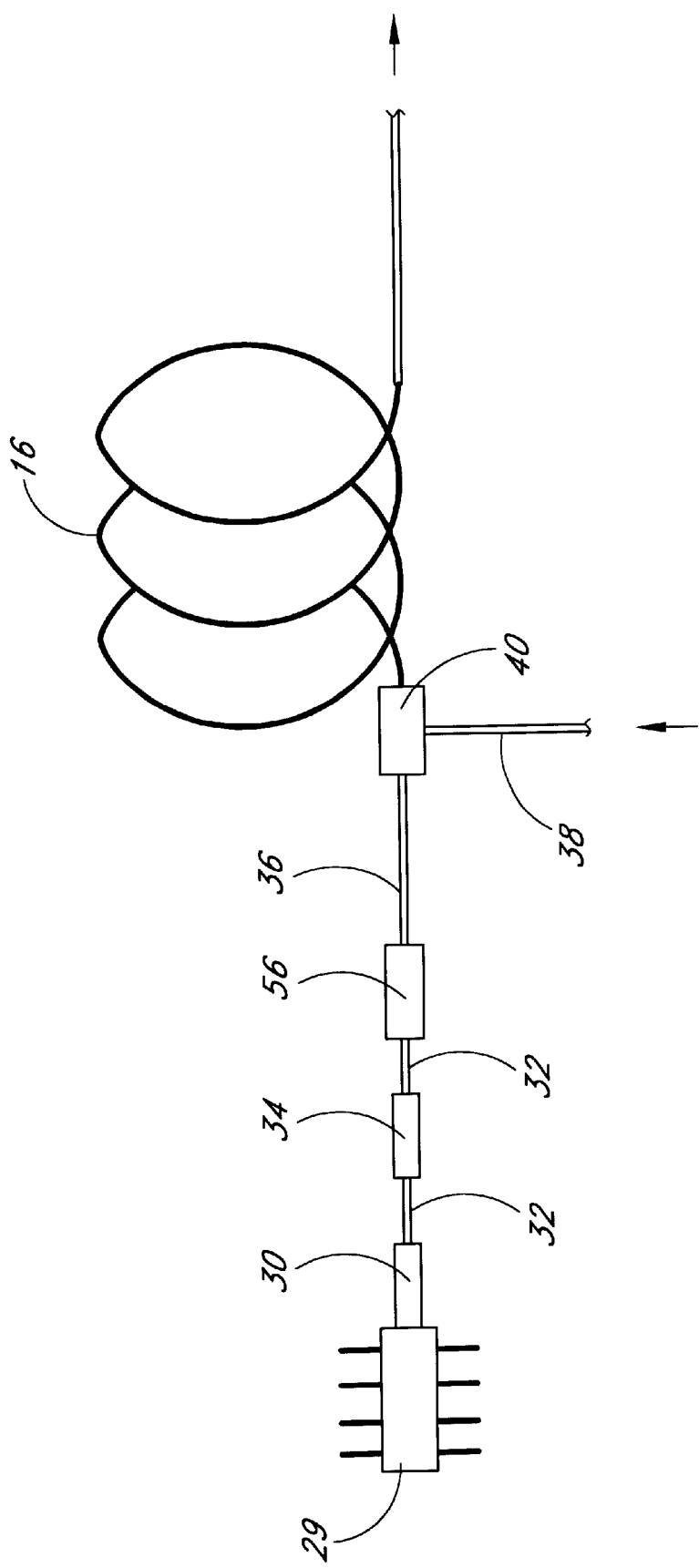
FIG. 4 is a schematic view of a preferred embodiment of the present invention similar to that shown in FIG. 2A additionally comprising a polarization controller.
Figure 5:
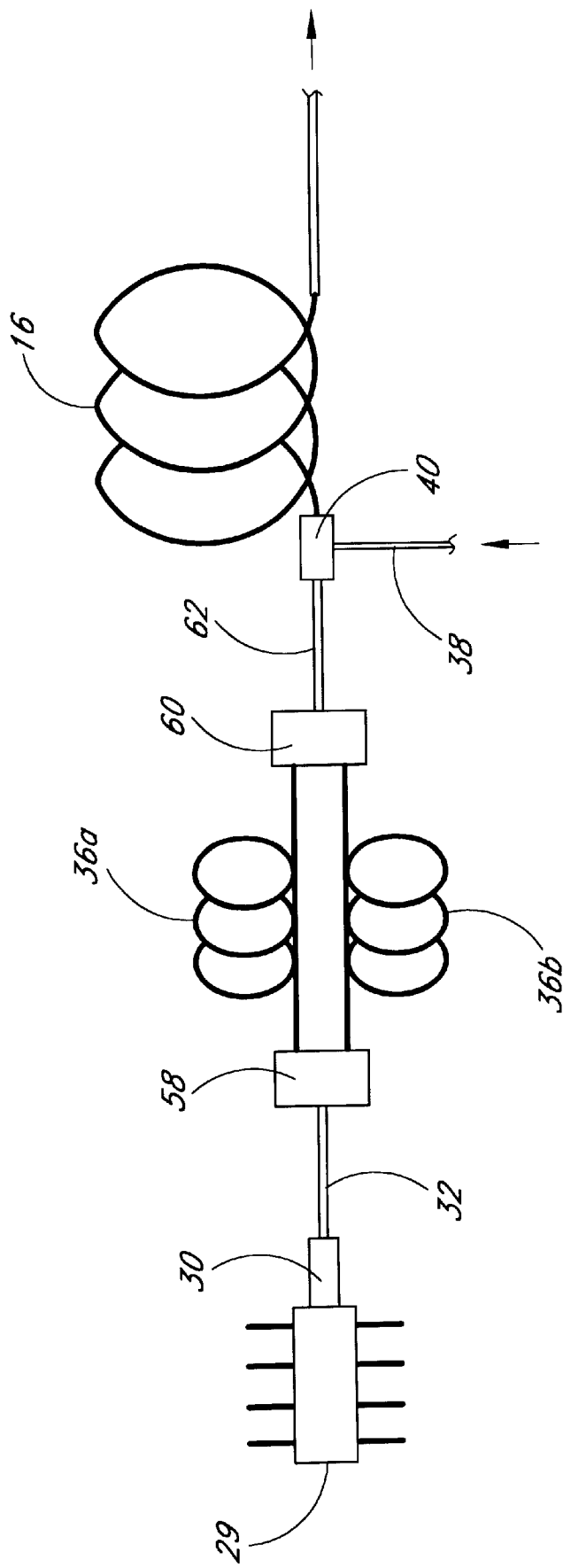
FIG. 5 is a schematic view of a preferred embodiment of the present invention comprising a non-depolarizing birefringent optical fiber coupled to two depolarizing birefringent optical fibers.

In another embodiment of the present invention depicted in FIG. 4, the light source 12 additionally comprises a polarization controller 56 inserted between the non-depolarizing and depolarizing birefringent optical fibers 32, 36. Similar to the Raman amplifiers 10 described with reference to FIGS. 2A–2C, the semiconductor laser 29 is coupled to one end of the non-depolarizing birefringent optical fiber 32 through the fiber connector 30, the non-depolarizing birefringent optical fiber having a fiber Bragg grating 34 inserted therein. The other end of the non-depolarizing birefringent optical fiber 32, however, is joined to the polarization controller 56, which is connected to the depolarizing birefringent optical fiber 36. The depolarizing birefringent optical fiber 36 leads to the optical coupler 40, which is connected to the Raman amplifier gain medium 16. The input optical fiber 38 is also attached to the optical coupler 40 as described above.

The light emitted by the semiconductor laser 29 after passing through the non-depolarizing birefringent optical fiber 32 reaches the polarization controller 56. The polarization controller 56 provides the light, which is directed into the depolarizing birefringent optical fiber 36, with a preferred state of polarization. Thus, rather than rotating the orientation of the depolarizing birefringent optical fiber 36 about the z axis, the polarization is rotated about the z axis. In the embodiments depicted in FIGS. 2A–2C, as well as those depicted in FIGS. 3A–3C, the depolarizing birefringent optical fiber 36 is rotated to misalign the principal axis of the depolarizing fiber and the electric field of the pump beam. In contrast, in the embodiment shown in FIG. 4, the electric field of the light emitted by the laser 29 is rotated with respect to the principal axes of the depolarizing birefringent optical fiber 36 using the polarization controller 56.

In either case, the extent of rotation determines the amount of light polarized parallel to the fast and the slow axes of the depolarizing birefringent optical fiber 36 or alternatively, the amount of light coupled into fast and slow modes supported by the optical fiber. The depolarizing birefringent optical fiber 36 supports two independent polarization modes, a fast mode and a slow mode; that is, the fiber transmits light polarized parallel to the fast axis and light polarized parallel to the slow axis. The linearly polarized pump beam can be divided into light of two orthogonal linearly polarized states, a first polarization state corresponding to light coupled into the fast mode and a second polarization state corresponding to light coupled into the slow mode.

The amount of light in the first linearly polarized state and the second linearly polarized state is determined by the orientation of the electric field of the light with respect to the fast and slow axis of the depolarizing birefringent optical fiber 36. If the light is linearly polarized in the direction of the fast axis, all the light will be coupled into the fast mode and no light will be coupled into the slow mode. If, however, the light has an electric field directed at an angle of 45° with respect to both the fast and the slow axes, then half the light will be coupled into the fast mode and half will be coupled into the slow mode. Similarly, for other linearly polarized states, unequal portions of the light will be coupled into the fast and slow modes of the depolarizing birefringent optical fiber. Thus, by varying the polarization state of the light emitted by the laser 29, and in particular, by rotating the electric field of linearly polarized laser output about the z axis, the portion of the light coupled into the fast and slow modes can be controlled. Preferably, equal portions of the light are distributed to the fast and slow modes of the depolarizing birefringent optical fiber. Thus, the polarization controller preferably is adjusted to provide linearly polarized light having an electric field directed at an angle of 45° with respect to both the fast and the slow axes. With use of the polarization controller 56, the non-depolarizing and depolarizing birefringent optical fibers 32, 36 need not be fixed in a specific orientation about the z axis to achieve this distribution that optimizes depolarization of the laser light.

FIGS. 5–8 depict other embodiments of the present invention that include an optical distributor 58 connecting the non-depolarizing birefringent optical fiber 32 to first and second depolarizing birefringent optical fibers 36a, 36b. As in the Raman amplifiers described above with reference to FIGS. 2–4, the semiconductor laser 29 is coupled to the non-depolarizing birefringent optical fiber 32 through the fiber connector 30. The non-depolarizing birefringent optical fiber 32 leads to the optical distributor 58, which may comprise a wavelength division multiplex (WDM) coupler or a polarization demultiplexer. Preferably, however, the optical distributor 58 preserves the polarization of the beam passing therethrough. The optical distributor 58 is connected to one end of the first and second depolarizing birefringent optical fibers 36a, 36b, which are terminated at another end by a beam combiner 60. A single-mode optical fiber 62 extends from the beam combiner 60 and leads to the optical coupler 40. As described above, the optical coupler 40 receives the input optical fiber 38 and is connected to the optical fiber Raman gain medium 16.

In one embodiment, the light beam from the semiconductor laser 29 is guided through the non-depolarizing birefringent optical fiber 32 to the optical distributor 58, which directs equal fractions of the beam into the first and second depolarizing birefringent optical fibers 36a, 36b. In this embodiment, the optical distributor 58 directs into the first depolarizing birefringent optical fiber primarily only light that is linearly polarized parallel to the fast axis of the first depolarizing birefringent fiber 36a. Similarly, the optical distributor 58 directs into the second depolarizing birefringent optical fiber 36b primarily only light that is linearly polarized parallel to the slow axis of the second depolarizing birefringent fiber. Accordingly, the optical distributor 58 couples one portion, preferably half, of the beam into the fast mode of the first depolarizing birefringent optical fiber 36a and another equal portion, preferably the other half, into the slow mode of the second depolarizing birefringent optical fiber 36b. The light in the fast mode propagates at a higher velocity than the light propagating the slow mode, thereby imparting phase delay as the light propagates in the first and second depolarizing birefringent optical fibers 36a, 36b. As described above, this phase delay translates into optical path difference. In this embodiment, the first and second depolarizing birefringent optical fibers 36a, 36b each have approximately equal lengths. This length is chosen to produce an optical path difference that is sufficiently large to reduce the coherence between the two portions (i.e., halves) of the beam and to thereby at least partially depolarize the beam. Alternatively, the first and second depolarizing birefringent optical fibers 36a, 36b can have different lengths. In this case, the optical path difference will be caused both by the disparity in the refractive index and the propagation velocities for the fast and slow polarization modes in the two depolarizing birefringent optical fibers and by the unequal lengths of the two depolarizing birefringent optical fibers. Again, the lengths can be chosen such that the optical path difference is sufficient to reduce the coherence between the two portions (i.e., halves) of the pump beam and to produce a depolarizing effect.

The two portions of the beam in the first and second depolarizing birefringent optical fibers 36a, 36b, respectively, are combined in the beam combiner 60. Preferably, the beam combiner 60 comprises a polarization preserving beam combiner and the beams transmitted through the first and second birefringent optical fibers 36a, 36b are linearly polarized perpendicular to each other when the pump beam is output from the beam combiner.

In another configuration, the optical distributor 58 directs equal portions of the beam from the laser 29 into the first and second birefringent optical fibers 36a, 36b without restricting the polarization of the light. Thus, light is coupled into both the fast and slow modes of the first depolarizing birefringent optical fiber 36a and into both the fast and slow modes of the second depolarizing birefringent optical fiber 36b. The first and second depolarizing birefringent optical fibers 36a, 36b, however, have different lengths. The difference in length of the two depolarizing birefringent optical fibers 36a, 36b is large enough to produce sufficient optical path difference to reduce the coherence between the light in the two fibers and to at least partially depolarize the pump beam. The light in the first and second depolarizing birefringent optical fibers 36a, 36b is combined in the beam combiner 60, and this pump beam is directed to the optical fiber Raman gain medium 16 after being transmitted through the single mode optical fiber 62 and coupled with the optical signal in the fiber optic coupler 40.

Alternatively, equal portions of the beam from the laser 29 are coupled into the fast mode of the first birefringent optical fiber 36a as well as the fast mode of the second birefringent optical fiber 36b or into the slow mode of the first and second birefringent optical fibers 36a, 36b. Additionally, the first and second birefringent fibers 36a, 36b have different lengths so as to introduce an optical path difference greater than the coherence length between the light exiting the two fibers. As in the other configurations, the two beams are brought together in the beam combiner 60, and are directed to the optical fiber Raman gain medium 16 after being transmitted through the single mode optical fiber 62 and combined with the optical signal in the fiber optic coupler 40.

FIGS. 6–8 differ in that in FIG. 6, the fiber Bragg grating 34 is inserted in the non-depolarizing birefringent optical fiber 32, in FIG. 7, the polarization controller 56 is inserted in the non-depolarizing birefringent optical fiber, and in FIG. 8, both the fiber Bragg grating and the polarization controller are inserted in the non-depolarizing birefringent optical fiber. As discussed above, by providing the non-depolarizing birefringent optical fiber 32 with a fiber Bragg grating 34, an external resonator is formed for the semiconductor laser 29. The fiber Bragg grating 34 reflects light from the semiconductor laser 29 and narrows and stabilizes the wavelength distribution of the laser output beam. Also as discussed above, the polarization controller 56 adjusts the polarization of the beam input to the depolarizer 14 so as to optimize depolarization.

Figure 9A:
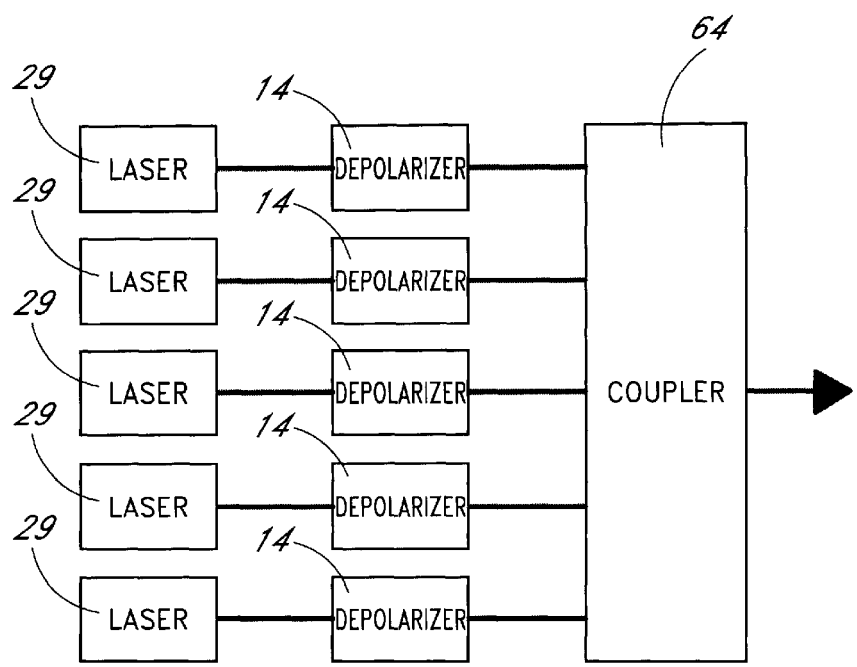
FIG. 9A is a schematic view of a preferred embodiment of the present invention wherein a plurality of semiconductor lasers and accompanying depolarizers are coupled to a multi-wavelength optical coupler.
Figure 9B:
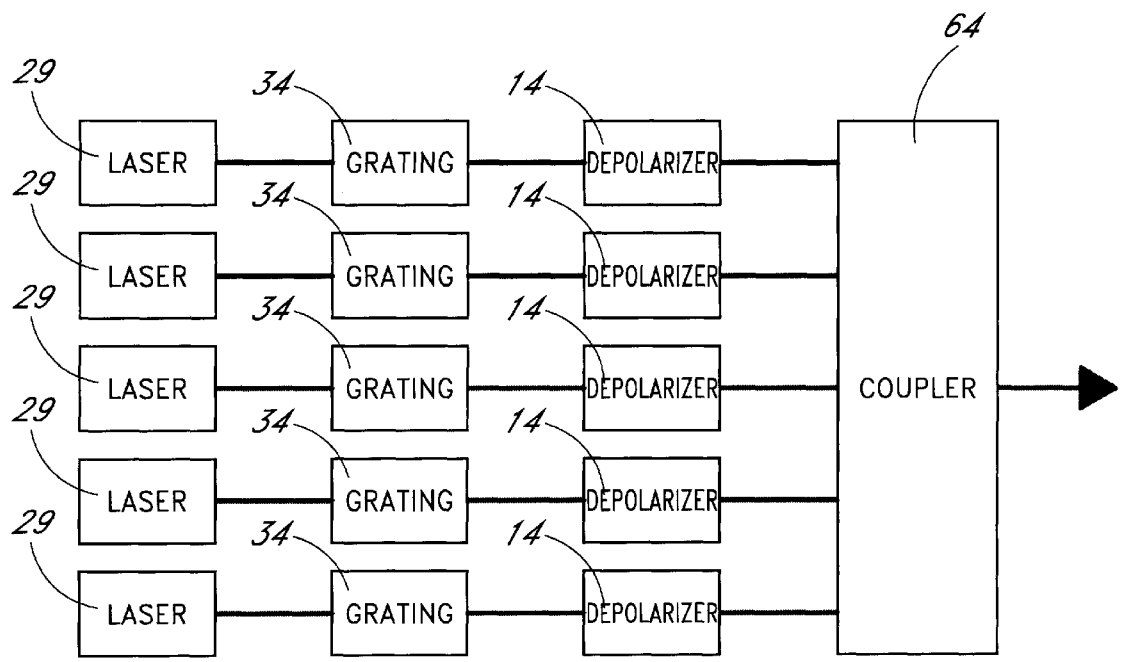
FIG. 9B is a schematic view similar to that shown in FIG. 9A with fiber Bragg gratings inserted between the lasers and depolarizers.
Figure 10:
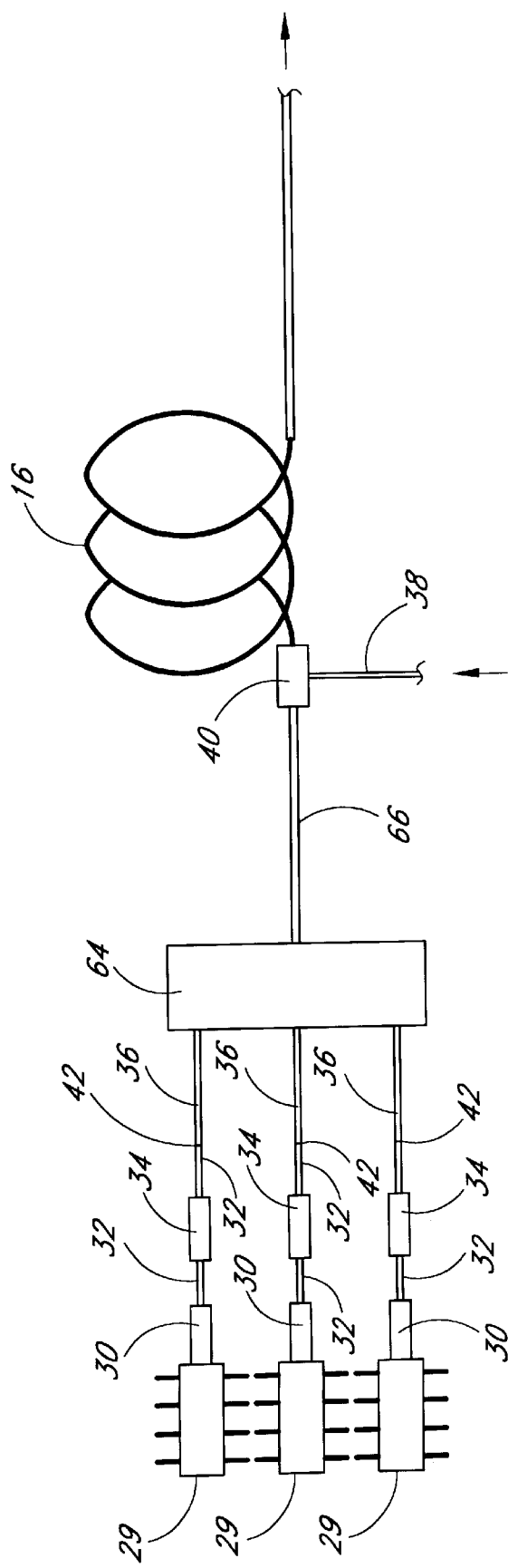
FIG. 10 is a schematic view of a preferred embodiment of the present invention showing the plurality of semiconductor lasers coupled to a plurality of non-depolarizing birefringent optical fibers that are joined to a plurality of depolarizing birefringent optical fibers that lead to the multi-wavelength optical coupler.
Figure 11A:
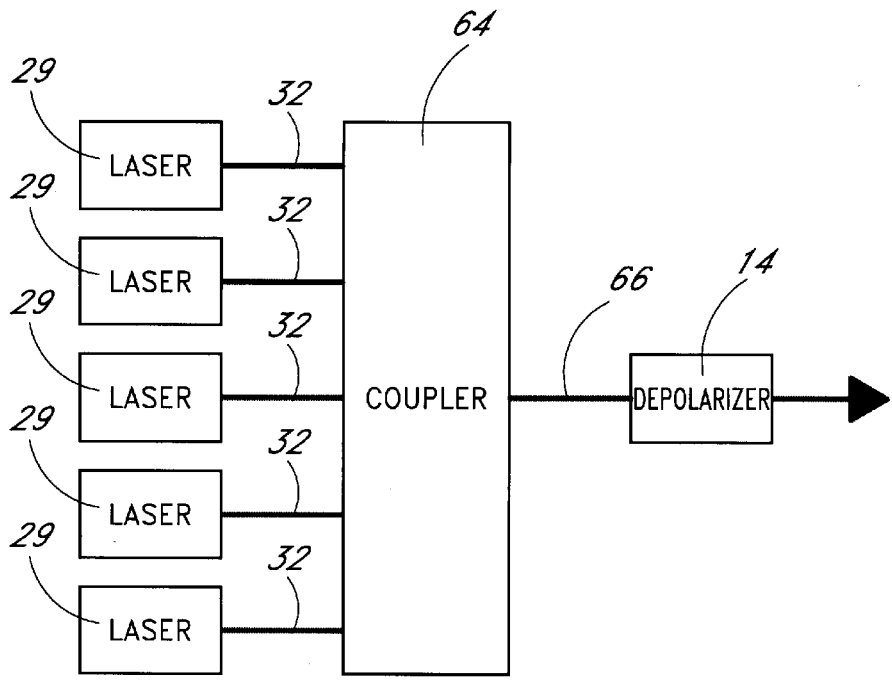
FIG. 11A is a schematic view of a preferred embodiment of the present invention wherein the plurality of semiconductor lasers are coupled to the multi-wavelength optical coupler, which is coupled to the depolarizer.
Figure 11B:
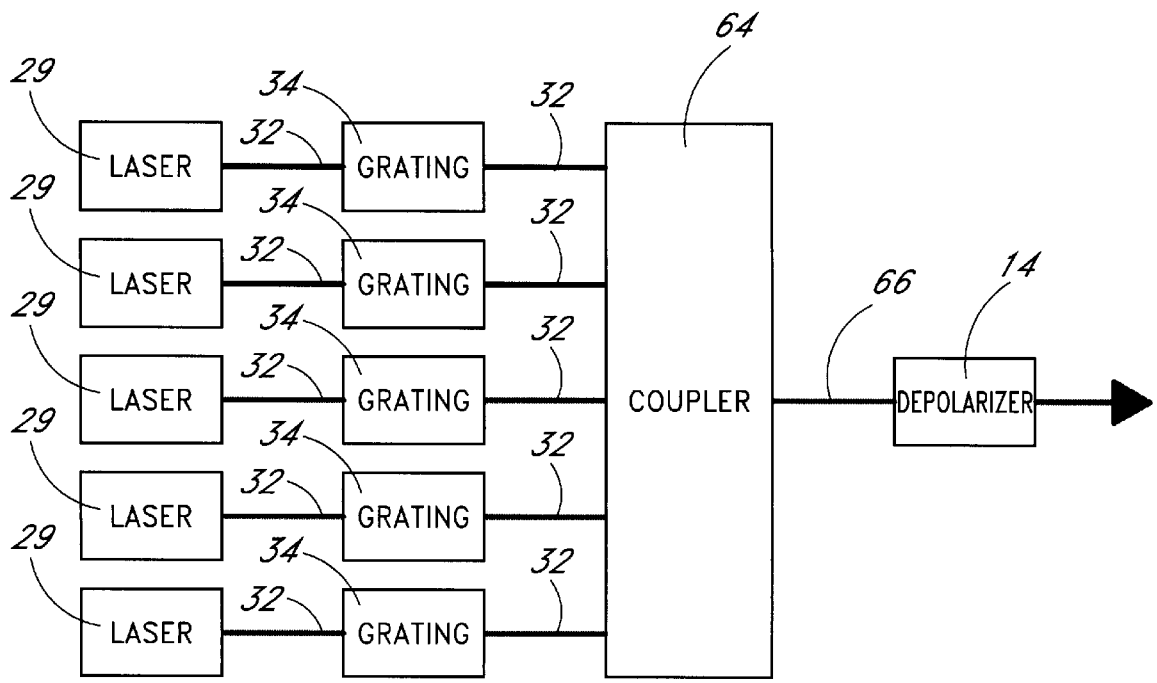
FIG. 11B is a schematic view similar to that shown in FIG. 11A with fiber Bragg gratings inserted between the lasers and the multi-wavelength optical coupler.

As shown in FIGS. 9–11, a Raman fiber amplifier 10 may comprise a plurality of semiconductor lasers 29 each emitting a light beam of a same or different wavelength. In one configuration illustrated in FIGS. 9A and 9B, a separate depolarizer 14 is associated with each individual laser 29, with this plurality of depolarizers being optically connected to a multi-wavelength optical coupler 64. Each of the depolarizers 14 receives light emitted from one of the semiconductor lasers 29 and produces at least partially depolarized light. The resultant plurality of partly depolarized beams of light are combined into a single pump beam within the multi-wavelength optical coupler 64. A separate fiber Bragg grating 34 can be inserted between each semiconductor laser 29 and the respective depolarizer 14 to tailor the wavelength distribution of the light output by the semiconductor lasers as shown in FIG. 9B. The same methods for producing and depolarizing light beams and for amplifying the signal as described above may be employed for a plurality of wavelengths. For example, as shown in FIG. 10, each laser 29 in the plurality of semiconductor lasers is coupled to one of the fiber connectors 30, which is connected to respective non-depolarizing birefringent optical fibers 32. Each of the non-depolarizing birefringent optical fibers 32 has the fiber Bragg grating 34 connected thereto, which is joined to one depolarizing birefringent optical fiber 36. Each depolarizing birefringent optical fiber 36 is linked to the multi-wavelength optical coupler 64, which has an optical fiber 66 extending therefrom. In general, an optical coupler such as the multi-wavelength optical coupler 64 shown in FIGS. 9A–9B, 10, and 11A–11B comprises one or more input lines connected to one or more output lines. The number of input and output lines depends on the application. In FIGS. 9A–9B, 10, and 11A–11B, the number of output lines is less than the number of input lines. More specifically, in FIG. 10, three input lines are coupled to the single optical fiber 66. This optical fiber 66 leads to the other optical coupler 40 that receives the input optical fiber 38. The optical fiber Raman gain medium 16 is attached to this optical coupler 40 as well.

Each laser 29 emits a beam in a different wavelength band. These beams, which are at least partly depolarized upon passing through the separate depolarizing birefringent optical fibers 36, are combined in the multi-wavelength optical coupler 64. The combined beam is transmitted through the optical fiber 66 to the other optical coupler 40 and sent on to the optical fiber Raman gain medium 16 along with the optical signal also received by the optical coupler. In this manner, a plurality of beams having same or different wavelengths can be at least partially depolarized and combined to form a pump beam for pumping the optical fiber Raman gain medium 16. Similarly, in any of the embodiments discussed above, a plurality of semiconductor lasers 29 can be employed to generate a beam comprising light in one or more wavelength bands, which is subsequently depolarized at least partially.

FIGS. 11A and 11B depict an alternative arrangement wherein the multi-wavelength optical coupler 64 precedes the depolarizer 14. In particular, the lasers 29 are connected to non-depolarizing optical fibers 32 that run to the multi-wavelength optical coupler 64. As illustrated in FIG. 11B, fiber Bragg gratings 34 can be inserted between two sections of the non-depolarizing optical fibers 32 to control and stabilize the wavelength light emitted by the semiconductor lasers 29. As in the embodiment shown in FIGS. 9A, 9B and 10, the optical fiber 66 extends from the multi-wavelength optical coupler 64, however, here the optical fiber leads to the depolarizer 14.

Thus, separate light beams having same or different wavelengths are generated by the plurality of lasers 29. These beams are guided through the non-depolarizing optical fibers 32 and to the multi-wavelength optical coupler 64 where they are combined and output into the optical fiber 66. The combined beam travels through the optical fiber 66 to the depolarizer 14 where the multi-wavelength beam is at least partially depolarized. After depolarization, the pump beam proceeds to the gain medium 16 as described above. In this manner, a light beam comprising a plurality of same or different laser wavelengths can be at least partially depolarized and employed to pump the optical fiber Raman gain 16 medium in the Raman amplifier 10. The use of a single depolarizer 14 as shown in FIGS. 11A and 11B simplifies the Raman amplifier 10 as compared to the embodiments depicted in FIGS. 9A, 9B and 10, which include a plurality of depolarizers. Depolarization, however, may not be as complete unless the polarization of each of the semiconductor lasers is aligned, e.g., with individual polarization transformers.

Figure 12:
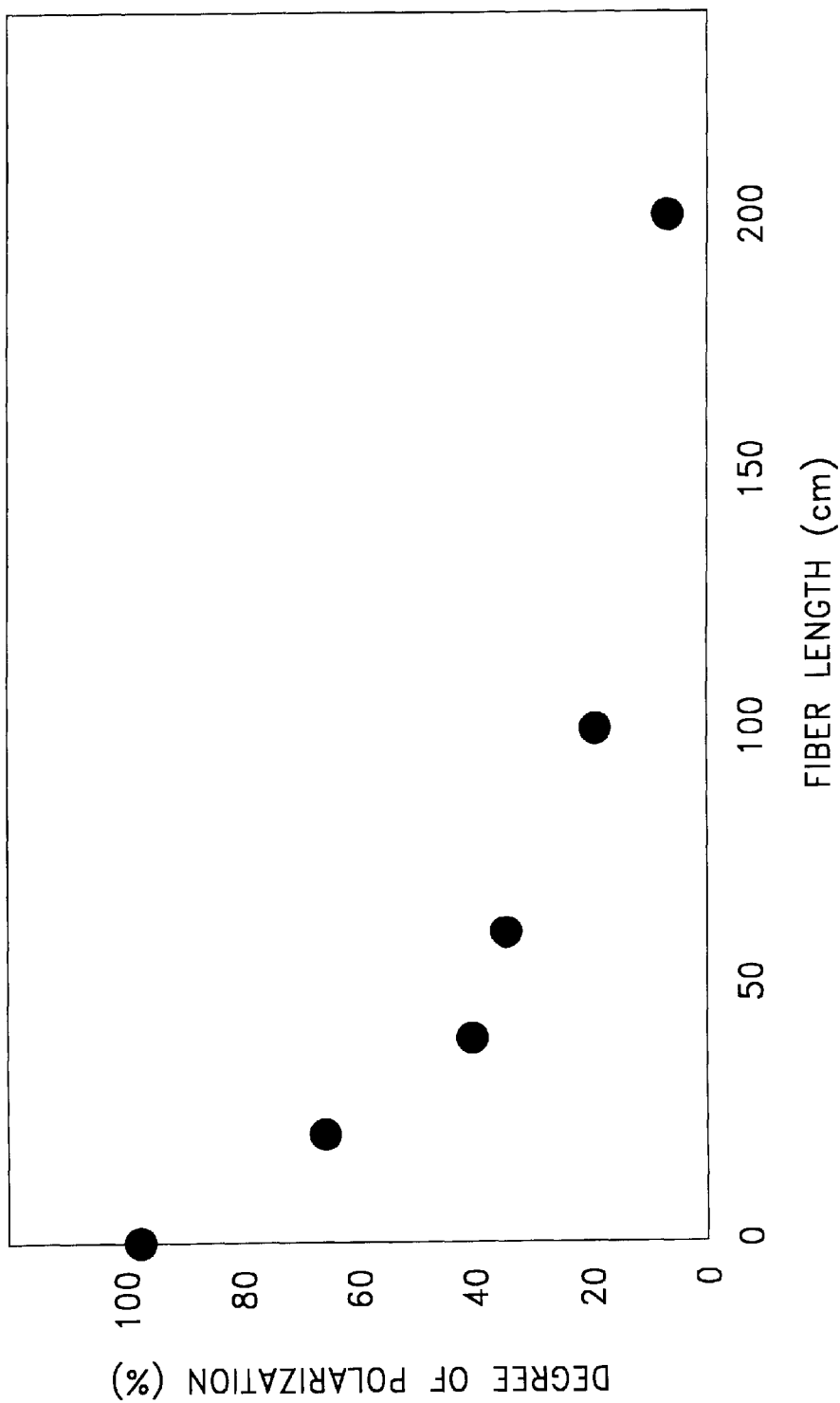
FIG. 12 is a plot, on axes of fiber length, in centimeters (cm), and degree of polarization (DOP), in percent, depicting how the degree of polarization is reduced with increasing length of the depolarizing birefringent optical fiber.

In accordance with the present invention, the length of the depolarizing birefringent optical fiber 36 can be adjusted to alter the degree of polarization (DOP). The value of DOP depends on the coherence length of the pump beam and the optical path difference between the light coupled into the fast and slow modes of the depolarizing birefringent optical fiber 36. The optical path difference is determined in part by the length of the depolarizing birefringent optical fiber 36. Accordingly, DOP depends on the length of the depolarizing birefringent optical fiber 36. In particular, the polarized component decreases with increasing length of the depolarizing birefringent optical fiber 36 as shown in FIG. 12, which plots the relationship between the DOP and the length of the depolarizing birefringent optical fiber. Values for DOP were measured at the end of the depolarizing birefringent optical fiber 36 connected to the optical coupler 40. This plot confirms that the DOP can be controlled by adjusting the length of the depolarizing birefringent optical fiber or fibers. It will be appreciated that any decrease in the polarization of the beam prior to entering the gain medium is advantageous. However, using the depolarization principles of the present invention, the degree of polarization (DOP) of the pump beam is advantageously decreased to at least about 40% or less. More preferably, the DOP is decreased below approximately 20%. It has been found that the DOP of the pump beam can be reduced to less than about 10% in some embodiments of the invention.

Figure 13:
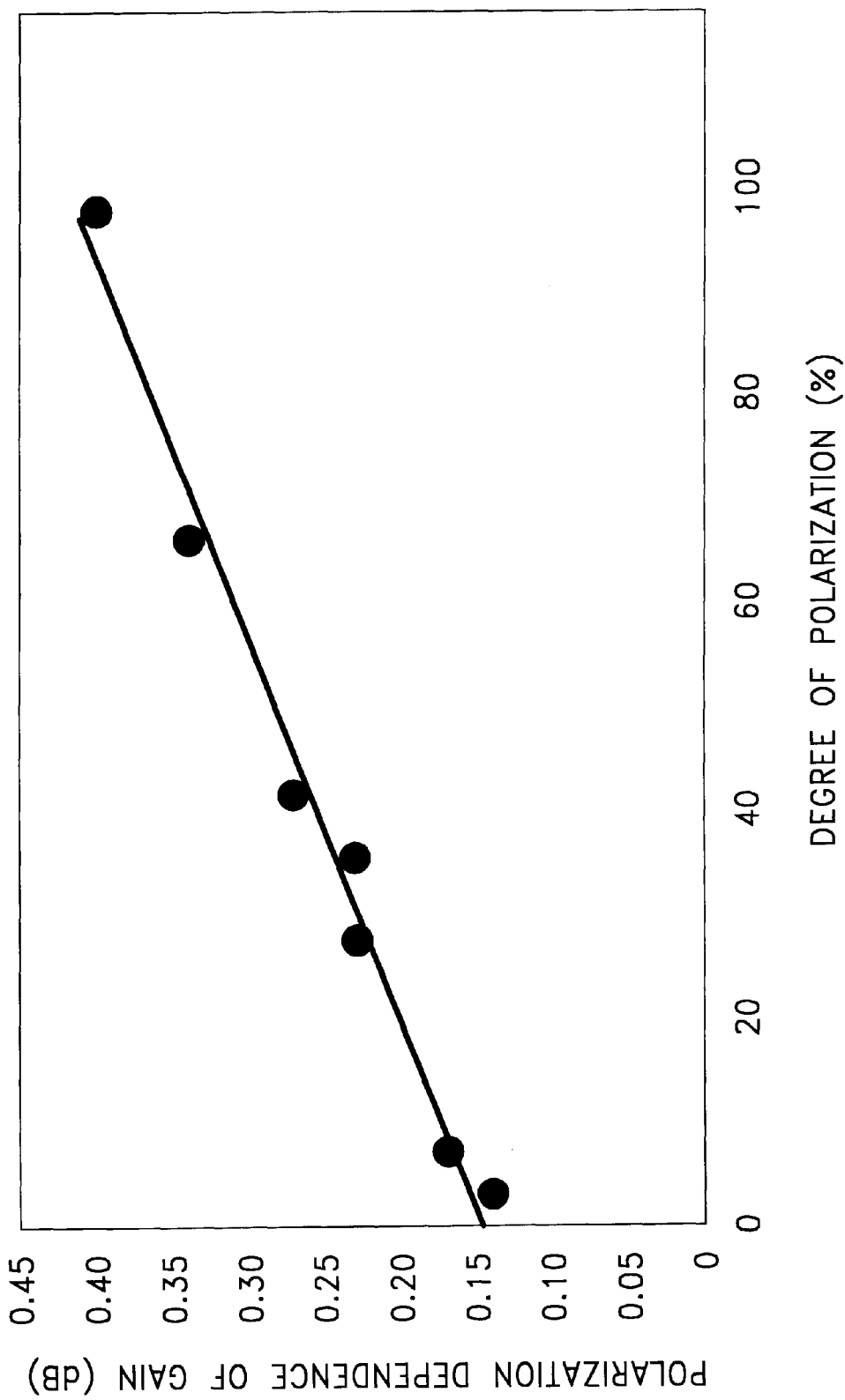
FIG. 13 is a plot, on axes of degree of polarization, in percent, and polarization dependence of gain (PDG), in decibels, illustrating how lowering the degree of polarization reduces the fluctuations in gain caused by fluctuations in polarization.

As described above, varying the DOP of the pump beam can control fluctuations in the optical fiber Raman gain. The level of fluctuations in gain is characterized by the polarization dependence of the optical fiber Raman gain (PDG), which is determined by measuring the difference between the maximum and minimum value of gain while changing the state of polarization of the signal being amplified. Measurements of PDG quantifies polarization dependent loss of the optical amplifier 10. FIG. 13 plots the PDG as the DOP of the pump beam is reduced using a preferred embodiment described above. The plot shows that the PDG decreases as the degree of polarization decreases, the PDG becoming closer to a value of polarization dependent loss, which in this case is equals 0.12 dB. Thus, optical pumping of an optical fiber Raman gain medium 16 with laser light that has been at least partially depolarized light reduces the fluctuations in the optical fiber Raman gain.

Accordingly, employing the depolarizer 14 in the fiber optical Raman amplifier 10 enables the polarization dependent gain fluctuations to be reduced. Stable gain is possible while using a single semiconductor laser 29 to pump the optical fiber Raman gain medium 16. The laser output need not be combined with light from a second source. The complexity of the Raman amplifier 10 is thus reduced as less semiconductor laser devices are required to optically pump the optical fiber Raman gain medium 16. As illustrated in FIGS. 2–11, this Raman amplifier 10 can operate with or without the inclusion of the fiber Bragg grating 34. However, optical pumping with light having a narrow wavelength distribution is advantageously provided by employing the fiber Bragg grating 34.

Although a plurality of Raman amplifiers 10 having different schemes for depolarizing the pump beam are shown in FIGS. 2–11, other depolarizers 14, such as other LYOT type depolarizers as well as Cornu type depolarizers can be employed in accordance with the invention to produce an at least partly depolarized pump beam. Accordingly, the depolarizer 14 may comprise birefringent components other than birefringent fiber such as birefringent crystal. Nevertheless, fiber depolarizers like the LYOT fiber depolarizer are preferred for integration into a fiber optic communication system 2. Additionally, other components within the optical amplifier 10 may comprise optical fiber, optical integrated waveguide devices, or both. For example, any of the optical couplers (optical coupler 40, optical distributor 58, beam combiner 60, multi-wavelength optical coupler 64) may be fiber or integrated optic waveguide devices or combinations thereof.

Furthermore, as described above, the semiconductor laser light sources 29 output substantially linearly polarized light, which can be at least partially depolarized so as to avoid variation in gain provide by the amplifier 10. The usefulness of the depolarizer 14, however, is not so limited, that is, the methods describe herein can be employed for light sources that output non-linearly polarized light. For example, circularly or elliptically polarized light can be at least partially depolarized, e.g., by coupling this light into a birefringent optical fiber, so as to minimize fluctuations in amplification provided by the Raman gain medium 16.

The present invention may be embodied in other specific forms without departing from the essential characteristics as described herein. The embodiments described above are to be considered in all respects as illustrative only and not restrictive in any manner. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of any invention is, therefore, indicated by the following claims rather than the foregoing description. Any and all changes which come within the meaning and range of equivalency of the claims are to be considered in their scope.

What is claimed is:

1. An optical signal amplifier comprising:
   at least one source of pumping light, said source being configured to produce pumping light having a predominant polarization state;
   at least one depolarizer comprising a birefringent optical component having a principal axis oriented at about 45 degrees with respect to said predominant polarization state and coupled to receive said pumping light as an input and having as an output a pumping beam, wherein said output pumping beam has a degree of polarization in an inclusive range of greater than 1% through approximately 40%; and
   a Raman gain medium configured to receive said pumping beam and optical signals as inputs and to transfer energy from said pumping beam to said optical signals via stimulated Raman scattering, said Raman gain medium being a dispersion compensating fiber.

2. The amplifier of claim 1, wherein said at least one source of light comprises a single semiconductor laser.

3. The amplifier of claim 1, wherein said at least one source of light comprises a plurality of semiconductor lasers.

4. The amplifier of claim 3, wherein each of said plurality of semiconductor lasers has a different center frequency.

5. The amplifier of claim 3, further comprising a beam combiner configured to receive light from at least two of said semiconductor lasers and to direct said light to said depolarizer.

6. The amplifier of claim 3, further comprising a beam combiner configured to receive said pump beam from at least two of said depolarizers, each of which are positioned to receive light from one of said semiconductor lasers.

7. The optical signal amplifier of claim 1, wherein said birefringent component comprises a birefringent fiber.

8. The optical signal amplifier of claim 1, wherein said birefringent component comprises a birefringent crystal.

9. A method of minimizing polarization dependent gain in a Raman amplifier comprising:
   routing laser light having a predominant polarization state through a single birefringent component that has a principal axis oriented at about 45 degrees with respect to said predominant polarization state so as to produce a pumping beam which has a degree of polarization in an inclusive range of greater than 1% through about 40%; and
   routing said pumping beam to a Raman gain medium, said Raman gain medium being a dispersion compensating fiber.

10. The method of claim 9, wherein polarization dependent gain in said Raman amplifier is limited to less than about 0.15 dB.

11. A light source for pumping a Raman gain medium in a Raman amplifier comprising:
   a laser light source configured to produce an output light beam having a predominant polarization state;
   a single birefringent component having an input port and an output port, wherein said input port is configured to receive said output light beam and having a principal axis oriented at about 45 degrees with respect to said predominant polarization state so as to produce a pumping beam which has a degree of polarization in an inclusive range of greater than 1% through about 40%, and wherein said output port is configured to couple said pumping beam to said Raman gain medium, said Raman gain medium being a dispersion compensating fiber.

12. The light source of claim 11, wherein said birefringent component comprises a birefringent fiber.

13. The light source of claim 11, wherein said birefringent component comprises a birefringent crystal.

* * * * *